United States Patent [19]

Hatakeyama

[11] Patent Number: 5,617,364
[45] Date of Patent: Apr. 1, 1997

[54] SEMICONDUCTOR MEMORY DEVICE

[75] Inventor: Atsushi Hatakeyama, Kawasaki, Japan

[73] Assignee: Fujitsu Limited, Kawasaki, Japan

[21] Appl. No.: 401,762

[22] Filed: Mar. 9, 1995

[30] Foreign Application Priority Data

Jun. 30, 1994 [JP] Japan ..................................... 6-150226

[51] Int. Cl.$^6$ ................................................ G11C 29/00
[52] U.S. Cl. ..................................... 365/200; 365/185.09
[58] Field of Search ..................................... 365/200, 201, 365/230.03, 189.09, 185.11

[56] References Cited

U.S. PATENT DOCUMENTS

| 4,639,897 | 1/1987 | Wacyk ..................................... 365/200 |
| 5,278,839 | 1/1994 | Matsumoto et al. ..................... 371/10.2 |
| 5,307,316 | 4/1994 | Takemae .............................. 365/230.03 |

FOREIGN PATENT DOCUMENTS 4-254998  9/1992  Japan .
5-151798  6/1993  Japan .

Primary Examiner—Tan T. Nguyen
Attorney, Agent, or Firm—Nikaido, Marmelstein, Murray & Oram LLP

[57] ABSTRACT

A semiconductor memory device includes a memory cell array having memory cells connected to word lines and bit lines, a redundant memory cell array having either a row redundancy array which is commonly provided to the memory cells and has redundant word lines for saving faulty word lines, or a column redundancy array which is commonly provided to the memory cells and has redundant bit lines for saving faulty bit lines, and a redundancy saving circuit including either one or more row redundancy array saving bit lines for saving one or more bit-line faults occurring in the row redundancy array or one or more column redundancy array saving word lines for saving one or more word-line faults occurring in the column redundancy array.

12 Claims, 12 Drawing Sheets

SEMICONDUCTOR MEMORY DEVICE

BACKGROUND OF THE INVENTION

1. Field of the Invention

The present invention generally relates to semiconductor memory devices, and more particularly to a semiconductor memory device equipped with redundant memory cells on the chip of the memory device.

The storage capacity per chip of semiconductor memory devices is increasing due to advances in the fine production techniques. On the other hand, it becomes more difficult to avoid faults caused in the production process. Hence, redundant memory cells are mounted on the chip in order to save faulty chips and improve the yield. Such redundant memory cells are used instead of faulty memory cells.

2. Description of the Prior Art and Related Art

FIG. 1 is a block diagram of a semiconductor memory device having a fault saving circuit. Generally, recent semiconductor memory devices such as shown in FIG. 1 are configured so that long wiring lines are segmented into parts to reduce a delay of time caused by the lines or a plurality of blocks obtained by dividing the memory cell array to perform parallel processing on a plurality of bits of data. The device shown in FIG. 1 is an example of devices having 16 memory cell blocks.

More particularly, the semiconductor memory device shown in FIG. 1 includes a memory cell array 10 having 16 divided blocks 10a, and an input/output buffer 12. The memory cell array 10 includes memory cells MC arranged in rows and columns, and redundant memory cells MCr arranged in rows and columns and intended to save faulty memory cells. Single circles denote normal memory cells MC, and double circles denote redundant memory cells MCr.

More specifically, each of the blocks 10a has redundant memory cells MCr. The memory cells MC are connected to word lines WL0, WL1, WL2, ... and bit lines BL0, BL1, BL2, .... The redundant memory cells MCr are connected to redundant word lines RWL0 and RWL1 and redundant bit lines RBL0 and RBL1. A row decoder 20 includes decoder parts (including word line drivers) respectively given to the word lines, and selects one of the word lines by decoding an external row address signal. A column decoder 14 includes decoder parts respectively given to the bit lines, and selects one of the bit lines by decoding an external column address signal via I/O gates (including sense amplifier) 16 respectively given to the bit lines. Similarly, there are provided a row redundancy circuit 22 having decoder parts respectively given to the redundant word lines, a column redundancy circuit 18 having decoder parts respectively given to the redundant bit lines, and I/O gates 19 respectively given to the decoder parts of the circuit 18.

If a test performed after the production identifies a faulty memory cell indicated by the hatched circle, the column redundancy circuit 18 is programmed so that the circuit 18 selects, for example, the redundant bit line RBL0 when receiving the column address signal specifying the bit line BL1, or the row redundancy circuit 22 is programmed so that the circuit 22 selects, for example, the redundant word line RWL0 when receiving the row address signal specifying the word line WL3. Hence, the redundant memory cell MCr indicated by symbol *1 or *2 is selected instead of the faulty memory cell when the latter cell is selected.

Semiconductor memory devices having redundant structures as described above are disclosed in, for example, Japanese Laid-Open Patent Application No. 4-254998 and Japanese Laid-Open Patent Application No. 5-151798.

However, the known structure shown in FIG. 1 has the following disadvantages.

As has been described previously, the redundant memory cells MCr are arranged in each of the blocks 10a, and designed to save redundant memory cells in the corresponding blocks. Hence, the redundant memory cells MCr arranged in a block cannot save faulty memory cells arranged in another block. If a large number of faults occur in a certain block, these faulty cells cannot be saved by the redundant memory cells in the other blocks. As a result, the chip having such faults will be discarded irrespective of whether there are many available redundant cells in the other blocks. The above shows that the efficiency of saving faulty cells by the fault saving circuit (the redundant circuit part) shown in FIG. 1 is low.

In order to improve the saving efficiency, it is necessary to provide a larger number of redundant memory cells MCr in each of the blocks 10a. However, this method needs a larger area on the chip to be occupied by the fault saving circuit.

It will be noted that the above disadvantages becomes more serious as the number of blocks increases. Nowadays, there is a trend to increase the storage capacity and thus increase the number of memory cell blocks. Under the above circumstance, the above disadvantages should be solved.

In order to overcome the above disadvantages, the inventors initially considered that the redundant memory cells are disposed separately from the blocks. That is, an array of redundant memory cells only is provided outside of the blocks of memory cells.

FIG. 2 is a block diagram of a semiconductor memory device taking into consideration the above arrangement. The semiconductor memory device shown in FIG. 2 includes a memory cell array 24 having a plurality of blocks 24a having no redundant memory cells, an input/output buffer/ redundant data switching circuit 26, a row redundancy array 28 and a column redundancy array 30. Each of the blocks 24a includes the circuit shown in FIG. 1 except for the fault saving circuit. As shown in FIG. 2, the row redundancy array 28 has bit lines BL0 and BL1 equal in number to the bit lines in one block, redundant word lines RWL0, RWL1, ..., a column decoder 32, and an I/O gate 34. The row redundancy array 28 further includes a row redundancy circuit 36, which includes unit circuits respectively given to the redundant word lines. Each of the unit circuits stores the row and block addresses of a faulty word line.

The external address applied to the memory cell array 24 shown in FIG. 2 includes the external row address and the external column address. In the memory device, the address is separated from a block address for selecting one of the blocks 24a, an address for selecting one of the word lines, and an address for selecting one of the bit lines. Hereinafter, the address for selecting one word line, and the address for selecting one bit line are referred to as a row address and a column address, respectively. The above-described row redundancy circuit 36 stores the block address of a faulty word line, and is hence capable of identifying the block having such a faulty word line. That is, one row redundancy array 28 can be given in common to the plural blocks 24a.

The row redundancy circuit 36 drives, when the input address coincides with the stored address (the row address and the block address), the corresponding redundant word line. After the redundant word line is driven and settled, the redundant memory cell MCr is selected in accordance with the column address, and data in the selected redundant memory cell MCr is sent to the I/O buffer/redundant data switching circuit 26.

As shown in FIG. 2, the column redundancy circuit 30 includes word lines WL0, WL1, . . . equal in number of those of one block of the array 24, redundant bit lines RBL0, RBL1, . . . , a column redundancy circuit 38, and an I/O gate 40. The column redundancy circuit 38 includes unit circuits respectively given to the redundant bit lines. Each of the unit circuits stores the column and block addresses of a faulty bit line.

After the word line is driven and settled in accordance with the applied row address, the applied column and block addresses are compared with the column and block addresses stored in the column redundancy circuit 38. When the applied addresses coincide with the stored address, the corresponding redundant bit line is selected, and data in the selected redundant memory cell MCr is sent to the I/O buffer/redundant data switching circuit 26. When the applied addresses do not coincide with the stored addresses, the column redundancy circuit 30 drives the word line uselessly.

However, the structure shown in FIG. 2 has a disadvantage in that if the row redundancy array 28 has a bit-line fault, it cannot save a faulty word line. For example, if the bit line BL0 in the row redundancy array 28 is broken (open) in a position indicated by symbol X shown in FIG. 2, the memory cell connected to the faulty word line and the bit line BL0 is no longer saved even when the faulty word line is replaced by the redundant word line. Similarly, the column redundancy array 30 has a word-line fault, it cannot save a faulty bit line. For example, if the word line WL1 in the column redundancy array 30 is broken (open) in a position indicated by symbol X, the memory cell connected to the word line WL1 and the faulty bit line is no longer saved even when the faulty bit line is replaced by the redundant bit line.

SUMMARY OF THE INVENTION

It is a general objects of the present invention to provide a semiconductor memory device in which the above disadvantages are eliminated.

A more specific object of the present invention is to provide a semiconductor integrated circuit memory device in which a faulty redundant memory cell in a redundant memory cell array separately from a normal memory cell array can be saved, so that the yield can be improved.

The above objects of the present invention are achieved by a semiconductor memory device comprising: a memory cell array having memory cells connected to word lines and bit lines; a redundant memory cell array having either a row redundancy array which is commonly provided to the memory cells and has redundant word lines for saving faulty word lines, or a column redundancy array which is commonly provided to the memory cells and has redundant bit lines for saving faulty bit lines; and a redundancy saving circuit including either one or more row redundancy array saving bit lines for saving one or more bit-line faults occurring in the row redundancy array or one or more column redundancy array saving word lines for saving one or more word-line faults occurring in the column redundancy array. The redundant memory cell array saves a faulty word line or bit line in the memory cell array. If a fault occurs in a bit line or word line in the redundant memory cell array, the redundant memory cell array saving circuit saves the faulty bit line in the row redundancy array or the faulty word line in the column redundancy array. As a result, it is possible to save the semiconductor memory device having a fault in the redundant memory cell array.

For example, the device further comprises means for selecting the above one or more row redundancy array saving word lines from an address signal given to the redundant word lines. That is, the above address signal is commonly used to select the one or more row redundancy array saving word lines and the redundant word lines. As a result, an increase in the circuit scale can be avoided.

For example, the device further comprises means for selecting the above one or more column redundancy array saving word lines from an address signal given to the redundant bit lines. Hence, the same advantage as described just above can be obtained.

For example, the memory cell array comprises a plurality of blocks. Further, the semiconductor memory device comprises means for selecting one of the redundant word lines from a block address for selecting one of the blocks and a row address for selecting one of the word lines of the memory cell array and for selecting the above one or more column redundancy array saving word lines from at least one of the block address and the row address.

For example, the memory cell array comprises a plurality of blocks. Further, the semiconductor memory device comprises means for selecting one of the redundant bit lines from a block address for selecting one of the blocks and a column address for selecting one of the bit lines of the memory cell array and for selecting the above one or more column redundancy array saving word lines from at least one of the block address and the column address.

For example, the device comprises: a memory cell array having memory cells connected to word lines and bit lines; a row redundancy array which is commonly provided to the memory cells and has redundant word lines for saving faulty word lines; a column redundancy array which is commonly provided to the memory cells and has redundant bit lines for saving faulty bit lines; a row redundancy array saving bit line circuit having one or more row redundancy array saving bit lines for saving one or more bit-line faults occurring in the row redundancy array; and a column redundancy array saving word line circuit having one or more column redundancy array saving word lines for saving one or more word-line faults occurring in the column redundancy array. A word-line fault and a bit-line fault can be saved by the row redundancy array and the column redundancy array, respectively. A bit-line fault in the row redundancy array can be saved by the row redundancy array saving bit line circuit, and a word-line fault in the column redundancy array can be saved by the column redundancy array saving word line circuit. Hence, it is possible to save the device even if faults occur in both the row and column redundancy arrays.

For example, the device further comprises: first means for selecting the above one or more row redundancy array saving word lines from an address signal given to the redundant word lines; and second means for selecting the above one or more column redundancy array saving word lines from an address signal given to the redundant bit lines.

For example, the memory cell array comprises a plurality of blocks. Further, the semiconductor memory device comprises: first means for selecting one of the redundant word lines from a block address for selecting one of the blocks and a row address for selecting one of the word lines of the memory cell array and for selecting the above one or more column redundancy array saving word lines from at least one of the block address and the row address; and second means for selecting one of the redundant bit lines from the block address for selecting one of the blocks and a column address for selecting one of the bit lines of the memory cell array and for selecting the above one or more column redundancy array saving word lines from at least one of the block address and the column address.

For example, the above first means comprises means for storing first information regarding whether or not the column redundancy array should be saved and for selecting the above one or more column redundancy array saving word lines from at least one of the block address and the row address when the first information shows that the column redundancy array should be saved. The second means comprises means for storing second information regarding whether or not the row redundancy array should be saved and for selecting the above one or more row redundancy array saving bit lines from at least one of the block address and the column address when the second information shows that the row redundancy array should be saved.

For example, the block address is grouped into a first group and a second group. The first means comprises means for selecting, for one or more faulty word lines in the memory cell array, one or more redundant word lines of the row redundancy array from the first group of the block address; and means for selecting, for one or more faulty bit lines in the memory cell array, one ore more redundant bit lines of the column redundancy array from the second group of the block address.

For example, the row redundancy array saving bit line circuit comprises one or more row redundancy array saving bit lines every block, the block being defined for the row address. The column redundancy array saving word line circuit comprises one ore more column redundancy array saving word lines every block, the block being defined for the column address.

For example, the device further comprises a switching circuit selecting one of the memory cell array, the row redundancy circuit and the column redundancy circuit in order to receive data from an outside of the semiconductor memory device and transmit data to the outside thereof.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
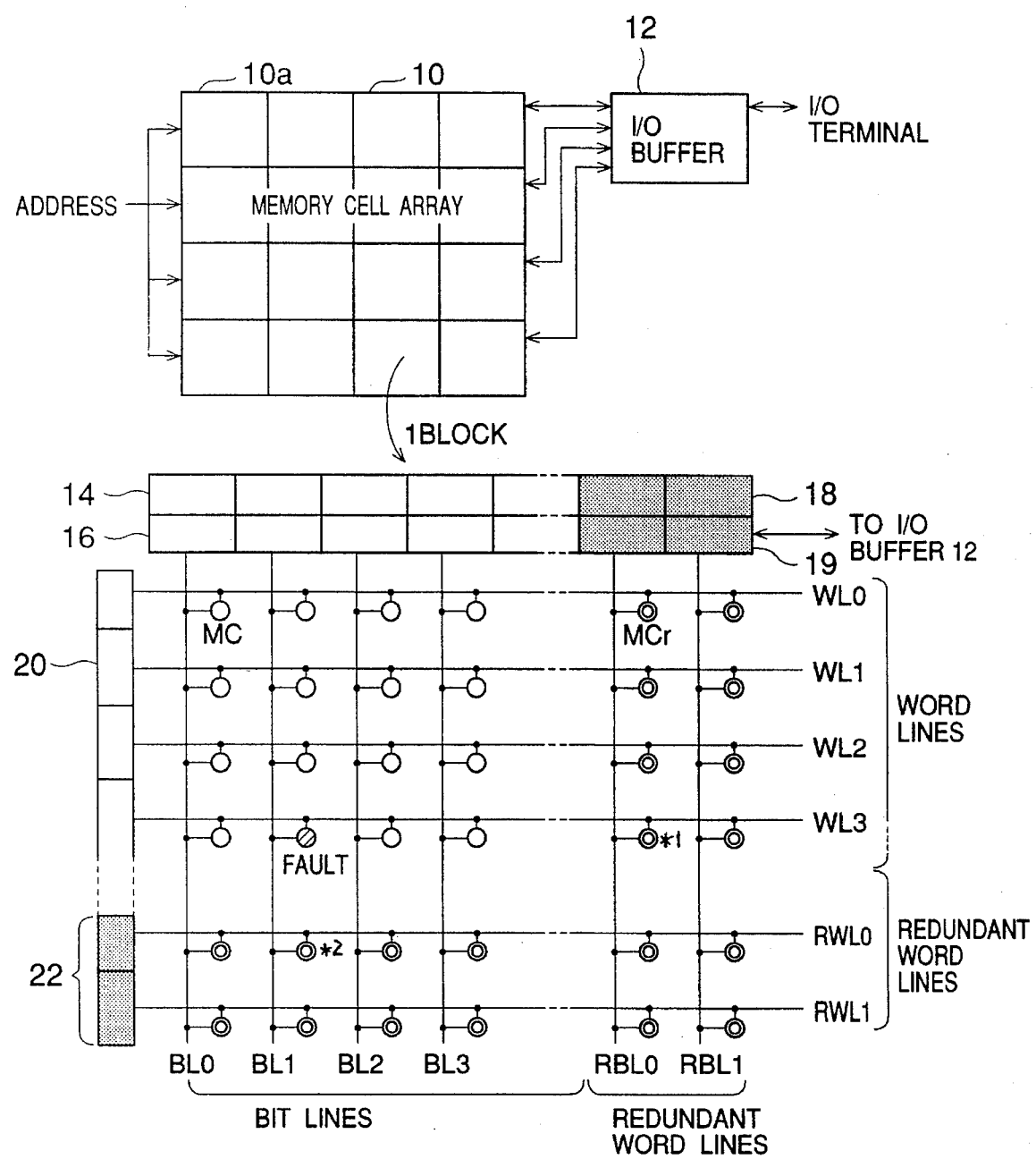
FIG. 1 is a block diagram of a semiconductor memory device having a conventional redundant structure.
Figure 2:
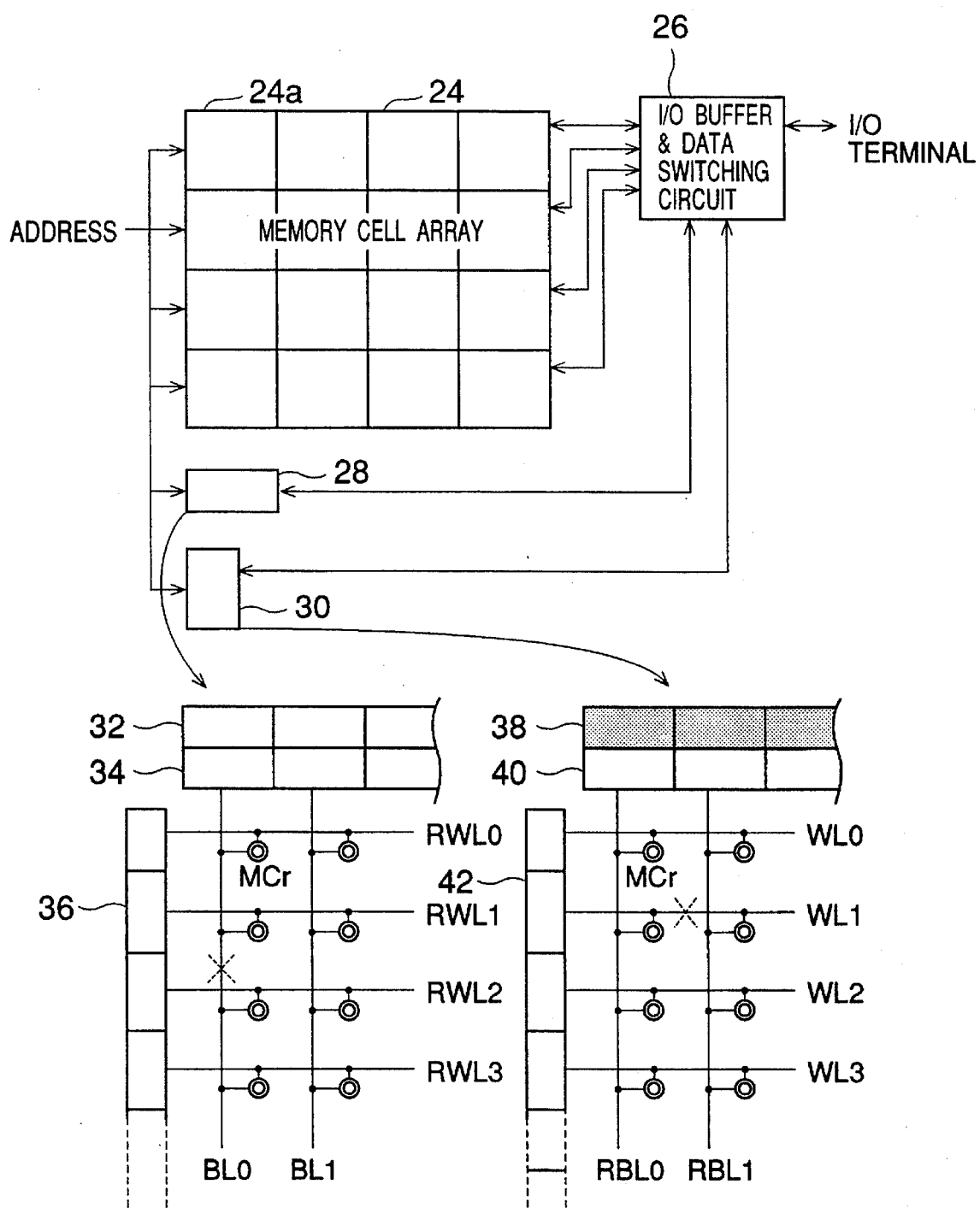
FIG. 2 is a block diagram of a semiconductor memory device having a redundant structure considered by the inventors in order to eliminate the disadvantages of the device shown in FIG. 1.
Figure 3:
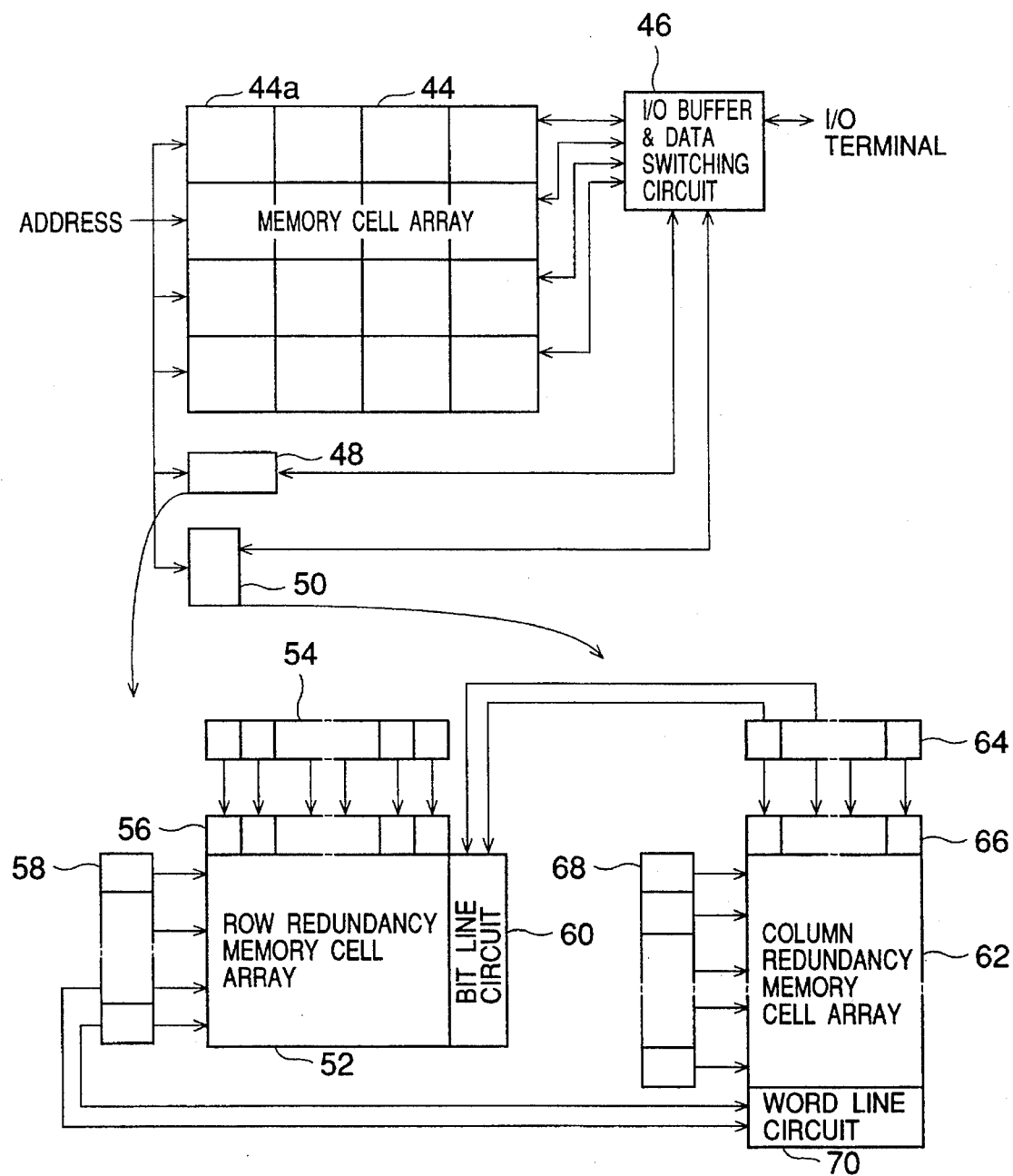
FIG. 3 is a block diagram of an essential part of a semiconductor memory device according to a first embodiment of the present invention.

FIG. 3 is a block diagram of an essential part of a semiconductor memory device according to a first embodiment of the present invention. The semiconductor memory device shown in FIG. 3 includes a memory cell array 44, an I/O buffer/redundant data switching circuit 46, a row redundancy array 48, and a column redundancy array 50. The memory cell array 44 includes a plurality of blocks 44a, each having no redundant memory cells. One block and one memory cell therein are selected by the aforementioned block address, the row address and the column address.

The row redundancy array 48 includes a row-redundancy memory cell array 52, a column decoder 54, an I/O gate 56 (including a sense amplifier), a row redundancy circuit 58 and a bit line circuit 60 for saving the row-redundancy memory cell array 52.

Figure 4:
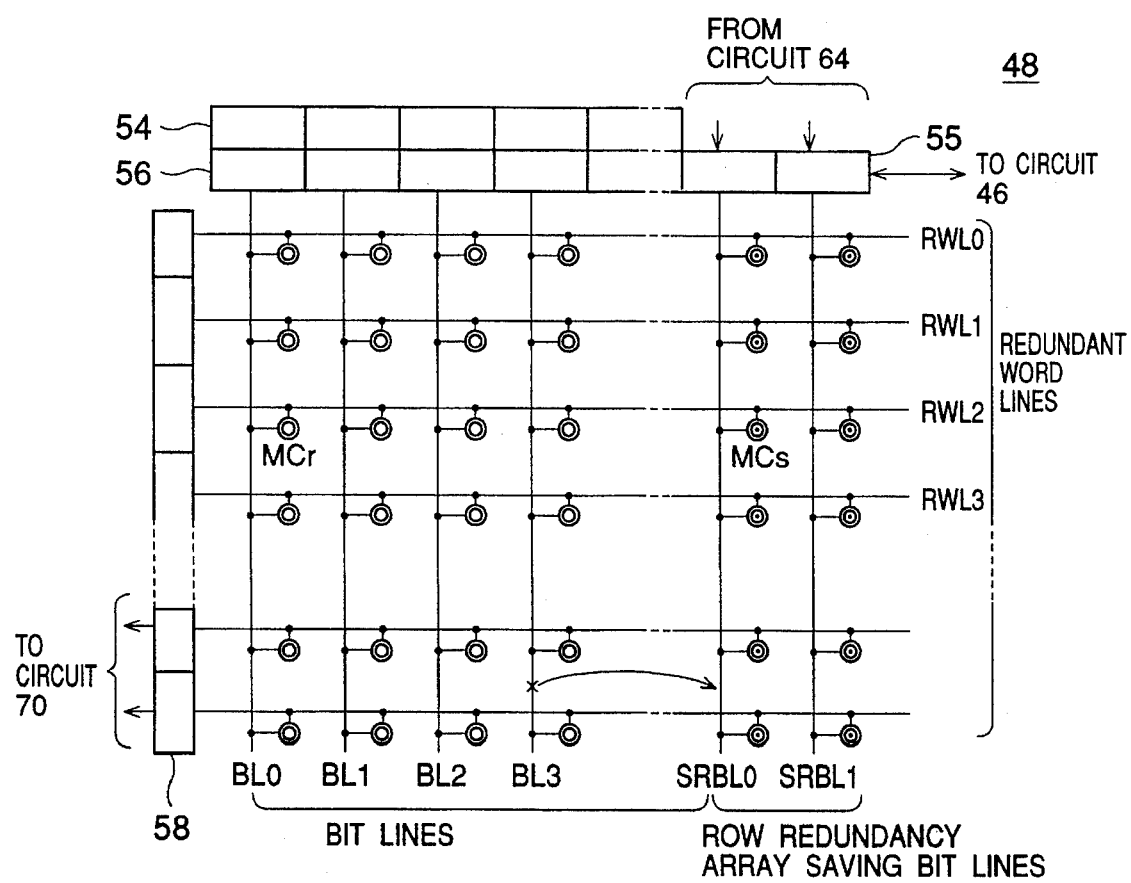
FIG. 4 is a block diagram of a structure of a row redundancy array shown in FIG. 3.

FIG. 4 is a block diagram of the row redundancy array 48. The row-redundancy memory cell array 52 provided in the array 48 includes bit lines BL0, BL1, . . . equal in number to those of one block 44a, redundant word lines RWL0, RWL1, . . . , and redundant memory cells MCr connected to the above bit and word lines. The column decoder 54 includes unit circuits respectively given to the bit lines, each of the unit circuits decoding the column address. The I/O gate 56 includes gate circuits and sense amplifiers given to the bit lines. The row redundancy circuit 58 stores the block and row addresses of faulty word lines, and has the function of word line drivers.

The row redundancy array 48 includes a row redundancy array saving bit lines SRBL0 and SRBL1. Redundant saving memory cells MCs are provided at cross points of the row redundancy array saving bit lines SRBL0 and SRBL1 and the redundant word lines RWL0, RWL1, . . . . Selection of the row redundancy array saving bit lines SRBL0 and SRBL1 is carried out by a column redundancy circuit 64 of the column redundancy array 50 shown in FIG. 3. The unit circuits of the I/O gate 55 (including the unit circuits of the sense amplifier) are respectively connected to the row redundancy array saving bit lines SRBL0 and SRBL1.

The column redundancy circuit 64 of the column redundancy array 50 controls the I/O gate 55. The column redundancy circuit 64 includes a circuit that stores information regarding whether the row redundancy array 48 should be saved. When the information indicates saving of the row redundancy array 48, the column redundancy circuit 64 does not select the redundant bit line, but selects one of the row redundancy array saving bit lines. The above selecting operation will be described in more detail later.

If the bit line BL3 is selected in a state in which it is broken (open) in the position indicated by symbol X shown in FIG. 4, the substitute saving bit line SRBL0 is selected instead of the bit line BL3.

Turning to FIG. 3 again, the column redundancy array 50 includes a column redundancy memory cell array 62, a column redundancy circuit 64, an I/O gate (including a sense amplifier) 66, a row decoder 68, a column redundancy array saving word line circuit 70, and a redundant word line driver 72.

Figure 5:
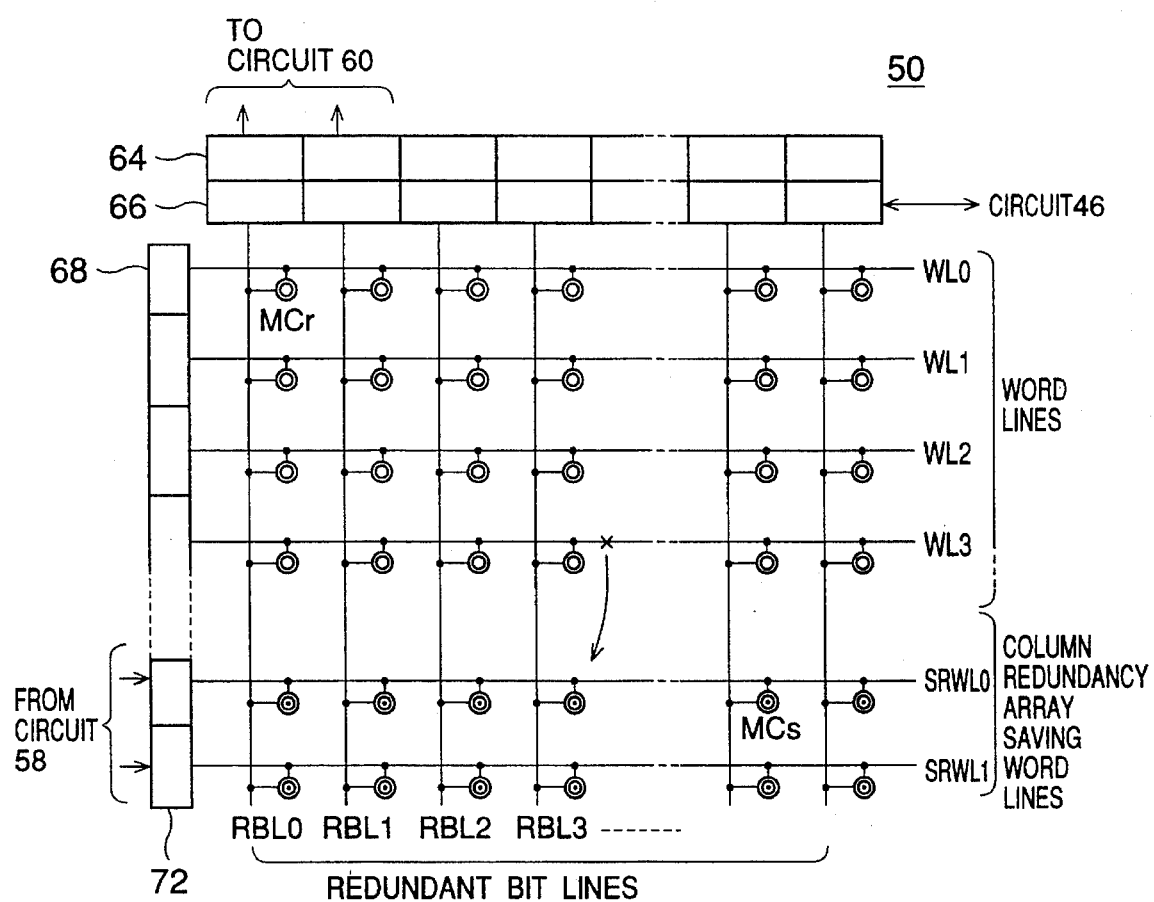
FIG. 5 is a block diagram of a structure of a column redundancy array shown in FIG. 3.

FIG. 5 is a block diagram of the column redundancy array 50. The column redundancy memory cell array 62 provided in the array 50 includes word lines WL0, WL1, ... equal in number to those in one block 44a, redundant word lines RWL0 and RWL1, and redundant memory cells MCr connected to these lines. The column redundancy circuit 64 includes unit circuits respectively given to the redundant bit lines RBL0, RBL1, ..., each of the unit circuits storing the block and column addresses of a faulty bit line. The I/O gate 66 includes gate circuits and sense amplifiers respectively given to the redundant bit lines RBL0, RBL1, ....

Further, the column redundancy array 50 includes column redundancy array saving word lines SRWL0 and SRWL1. Redundant saving memory cells MCs are provided at cross points of the column redundancy array saving word lines SRWL0 and SRWL1 and the redundant bit lines RBL0, RBL1, .... A row redundancy circuit 58 of the row redundancy array 48 shown in FIG. 3 performs a selecting operation on the column redundancy array saving word lines SRWL0 and SRWL1. A word line driver 72 is connected to the column redundancy array saving word lines SRWL0 and SRWL1. The row redundancy circuit 58 of the row redundancy circuit 48 drives the word line driver 72. The row redundancy circuit 58 has a circuit which stores information regarding whether the column redundancy array 50 should be saved. When the information indicates saving of the column redundancy array 50, the row redundancy circuit 58 does not select the redundant word line, but selects one of the column redundancy array saving word lines. This selecting operation will be described in more detail later.

For example, if the word line WL3 is broken (open) in the position indicated by symbol X shown in FIG. 5, the substitute column redundancy array saving word line SRWL0 is selected instead of the word line WL3.

As described above, the first embodiment of the present invention is configured so that the column redundancy circuit 64 that saves a faulty bit line occurring in the memory cell array 44 can selectively drive the row redundancy array saving bit lines SRBL0 and SRBL1 provided in the row redundancy array 48, and the row redundancy circuit 58 that saves a faulty word line occurring in the memory cell array 44 can selectively drive the column redundancy array saving word lines SRWL0 and SRWL1. That is, the first embodiment of the present invention is configured so that the row redundancy circuit 58 is capable of saving the memory cell array 44 and the column redundancy array 50, and the column redundancy circuit 64 is capable of saving the memory cell array 44 and the row redundancy array 48.

The row redundancy array 48 and the column redundancy array 50 will occupy a small area on the chip. Hence, a fault will occur in the arrays 48 and 50 with a possibility much less than a fault may occur in the memory cell array 44. Hence, it is sufficient to provide a small number of column redundancy array saving word lines and a small number of row redundancy array saving bit lines.

Figure 6:
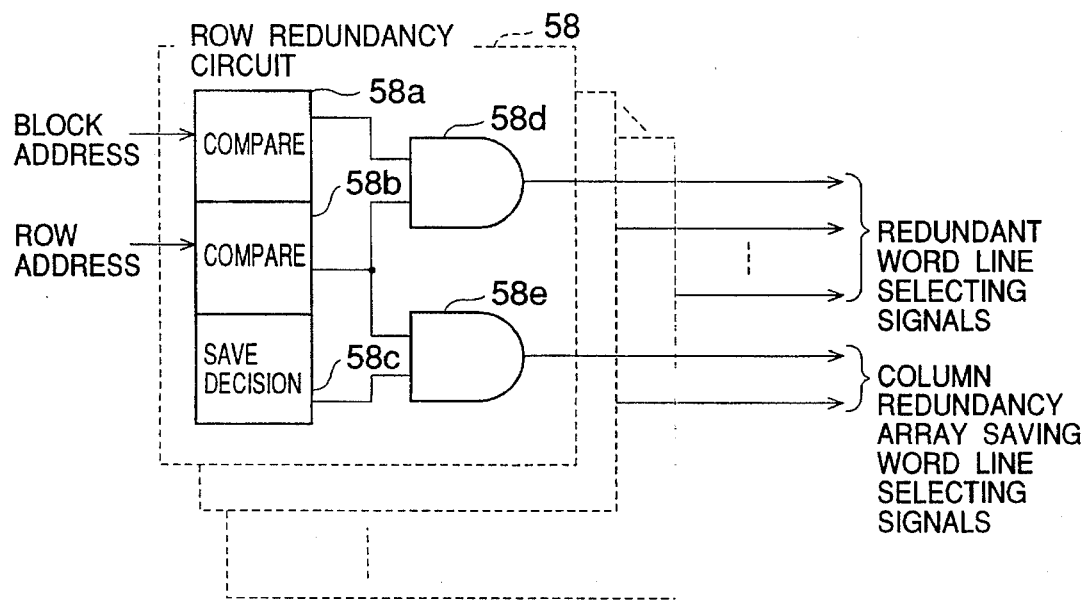
FIG. 6 is a block circuit of a structure of a row redundancy circuit shown in FIG. 4.

FIG. 6 is a block diagram of an example of the structure of the row redundancy circuit 58. The row redundancy circuit 58 has unit circuits respectively given to the redundant word lines RWL0, RWL1, .... Each of the unit circuits outputs a redundant word line selecting signal. Some unit circuits (two unit circuits in the example of FIG. 5) of the circuit 58 output word line selecting signals used to save the column redundancy array 50 in order to selectively drive the column redundancy array saving word lines SRWL0 and SRWL1. FIG. 5 shows the detail of the unit circuit outputting two selecting signals. Each of the unit circuits of the row redundancy circuit 58 outputting only the redundant word line selecting signal is made up of a block address compare/decision circuit 58a, a row address compare/decision circuit 58b, and an AND gate 58d. Each of the unit circuits of the circuit 58 outputting the two selecting signals further includes a column redundancy array saving decision circuit 58c and an AND gate 58e in addition to the circuits 58a, 58b and 58d. Each of all the unit circuits of the row redundancy circuit 58 may have the same configuration as shown in FIG. 6.

The block address compare/decision circuit 58a stores the block address of a block 44a (FIG. 3) in which there is a faulty word line. The row address compare/decision circuit 58b stores the row address of the above faulty word line. When the external address signal coincides with the block and row addresses respectively stored in the circuits 58a and 58b, the redundant word line selecting signal is output via the AND gate 58d. In actuality, the above redundant word line selecting signal is applied to a word line driver (not shown for the sake of simplicity), and this word line driver drives the corresponding redundant word line. It can be considered that the above word line driver is provided in the block denoting the row redundancy circuit 58.

The column redundancy array saving decision circuit 58c stores information regarding whether the corresponding column redundancy array saving word line shown in FIG. 4 should be selected. It is possible to generate, instead of the redundant word line selecting signal, the column redundancy array saving word line selecting signal by programming the row address compare/decision circuit 58b so that the row address of the saving word line to be selected (the address of a faulty word line in the column redundancy array 50) is stored and by programming the column redundancy array saving decision circuit 58b so that it outputs "1". In this case, the corresponding redundant word line cannot be used. However, in actuality, there is no possibility that all the redundant word lines are in use. As a result, there is no problem.

Figure 7:
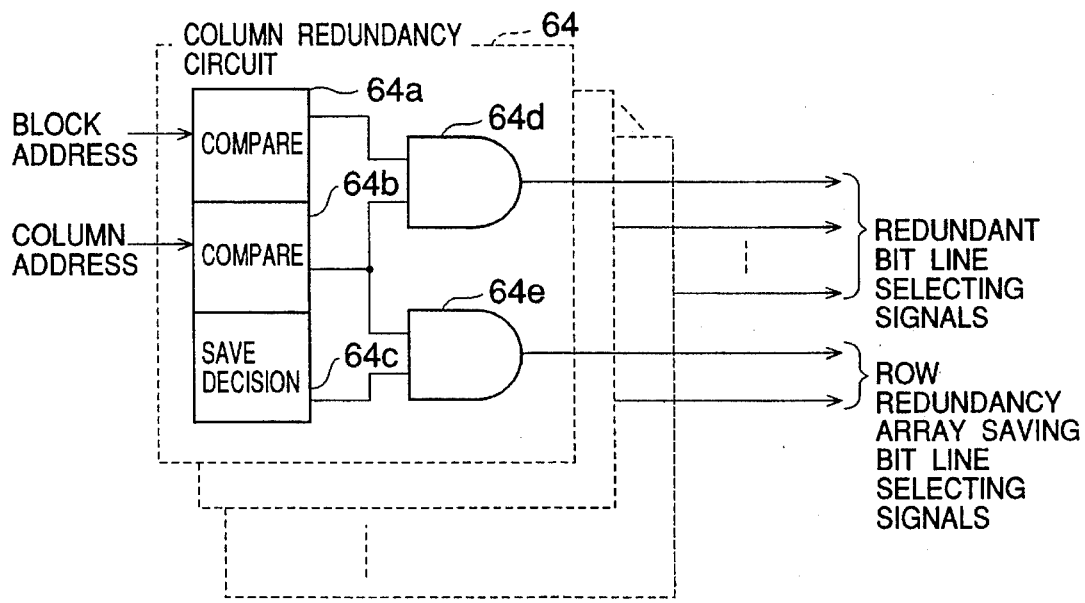
FIG. 7 is a block diagram of a structure of a column redundancy circuit shown in FIG. 4.

FIG. 7 is a block diagram of the column redundancy circuit 64, which unit circuits respectively given to the redundant bit lines RBL0, RBL1, .... Each of the unit circuits outputs a redundant bit line selecting signal. Some unit circuits (two unit circuits in the example of FIG. 7) of the circuit 64 outputs a bit line selecting signal for saving the row redundancy array 48. FIG. 7 shows the detail of the unit circuit outputting two selecting signals. Each of the unit circuits of the column redundancy circuit 64 outputting only the redundant bit line selecting signal is made up of a block address compare/decision circuit 64a, a column address compare/decision circuit 64b, and an AND gate 64d. Each of the unit circuits of the circuit 64 outputting the two selecting signals further includes a row redundancy array saving decision circuit 64c and an AND gate 64e in addition to the circuits 64a, 64b and 64d. Each of all the unit circuits of the column redundancy circuit 64 may have the same configuration as shown in FIG. 7.

The block address compare/decision circuit 64a stores the block address of a block 44a (FIG. 3) in which there is a faulty bit line. The column address compare/decision circuit 64b stores the column address of the faulty bit line. When the external address signal coincides with the block and column addresses respectively stored in the circuits 64a and 64b, the redundant bit line selecting signal is output via the AND gate 64d. The above redundant bit line selecting signal drives the corresponding redundant bit line via the I/O gate 66.

The row redundancy array saving decision circuit 64c stores information regarding whether the corresponding row redundancy array saving bit line shown in FIG. 4 should be selected. It is possible to generate, instead of the redundant bit line selecting signal, the row redundancy array saving bit line selecting signal by programming the column address compare/decision circuit 64b so that the column address of the row redundancy array saving bit line to be selected (the address of a faulty bit line in the row redundancy array 48) is stored and by programming the row redundancy array saving decision circuit 64b so that it outputs "1". In this case, the corresponding redundant bit line cannot be used. However, in actuality, there is no possibility that all the redundant bit lines are in use. As a result, there is no problem.

Figure 8:
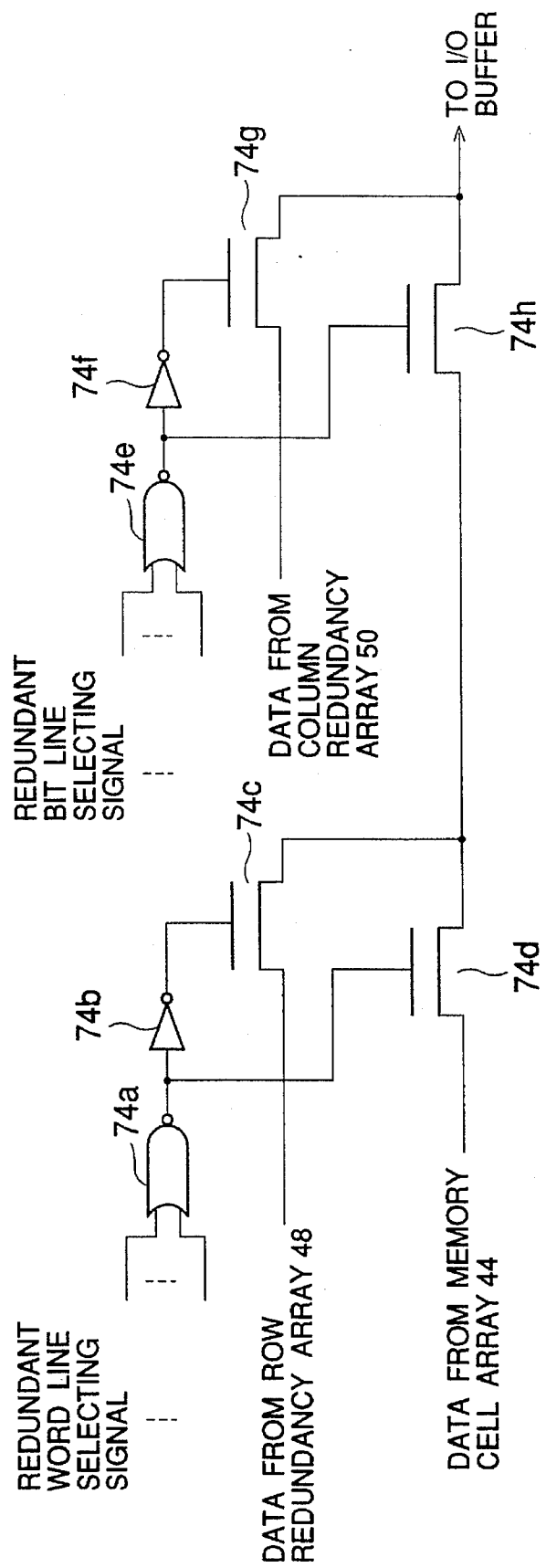
FIG. 8 is a circuit diagram of a redundant data switching circuit part of an input/output and redundant data switching circuit shown in FIG. 3.

FIG. 8 is a circuit diagram of the redundant data switching circuit part of the I/O buffer/redundant data switching circuit 46 shown in FIG. 3. A NOR gate 74a receives the redundant word line selecting signals from the row redundancy circuit 58, and applies the result of the NOR operation thereon to the gate of an N-channel transistor 74d and an inverter 74b. The output signal of the inverter 74b is applied to the gate of an N-channel transistor 74c. When all the redundant word line selecting signals are OFF (at a low level), the transistor 74c is OFF and the transistor 74d are ON. Hence, data from the memory cell array 44 passes through the transistor 74d. When one of all the redundant word line selecting signals is turned ON (switched to a high level), the transistor 74c is turned ON, and the transistor 74d is turned OFF. Hence, data from the row redundancy array 48 passes through the transistor 74c.

A NOR gate 74e receives the redundant bit line selecting signals from the column redundancy circuit 64, and applies the result of the NOR operation thereon to the gate of an N-channel transistor 74h and an inverter 74f. The output signal of the inverter 74f is applied to the gate of an N-channel transistor 74g. When all the redundant bit line selecting signals are OFF (at the low level), the transistor 74g is OFF and the transistor 74h is ON. Hence, data from the transistor 74c or 74d can pass through the transistor 74h. When one of all the redundant bit line selecting signals is turned ON (switched to the high level), the transistor 74g is turned ON and the transistor 74h is turned OFF. Hence, data from the column redundancy array 50 is applied to the I/O buffer connected to an I/O terminal (not shown).

As described above, according to the first embodiment of the present invention, it is possible to save a bit-line fault or a word-line fault even if such a fault occurs in the row redundancy array 48 or the column redundancy array 50. Further, it is possible to select the corresponding saving bit line by the unit circuit of the column redundancy circuit 64 which is idle. Hence, faults in the row redundancy array 48 and/or the column redundancy array 50 can be saved by adding a small scale of circuit.

A description will now be given of a second embodiment of the present invention with reference to FIG. 9.

The second embodiment of the present invention relates to a 16M (mega-bit) DRAM (Dynamic Random Access Memory) device. It is necessary to use 24 address bits in order to access a memory area of 16 mega-bits. Normally, DRAM devices have 12 address terminals equal to half of the 24 address bits. The address data is applied, twice, to the half number of address terminals (12 address terminals in the example shown in FIG. 9). Hereinafter, the first applied 12 address bits are denoted by RA00–RA11, and the second applied 12 address bits are referred to as CA00–CA11. The block address having the structure shown in FIG. 9 employs five bits consisting of three bits among the bits RA00–RA11, and two bits among the bits CA00–CA11. In the following description, it will be assumed that the above five bits are RA09, RA10, RA11, CA10 AND CA11.

Figure 9:
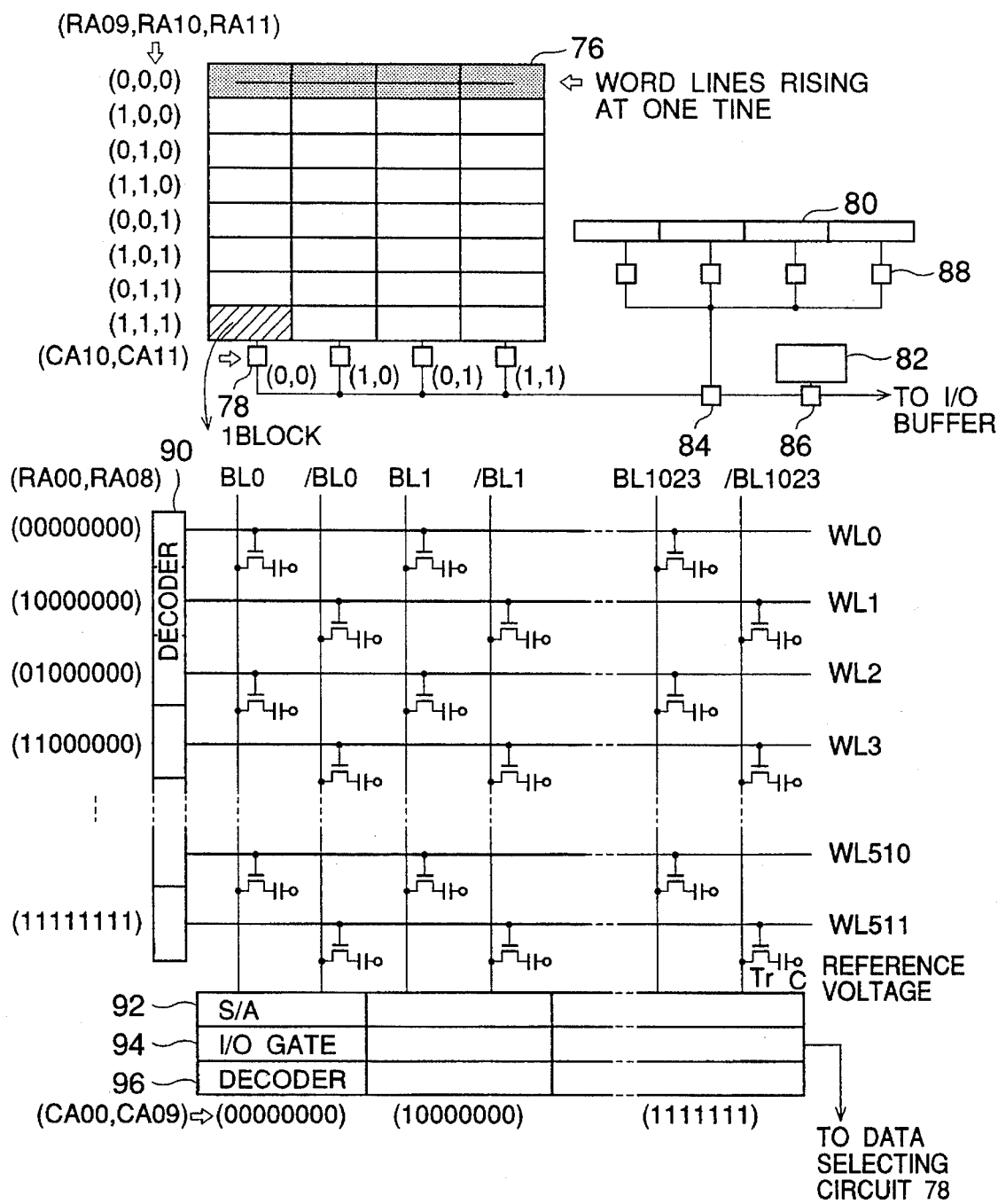
FIG. 9 is a block diagram of a second embodiment of the present invention.

The DRAM device shown in FIG. 9 includes a memory cell array 76, four data selecting circuits 78, a row redundancy array 80, a column redundancy array 82, a row redundancy data switching circuit 84, a column redundancy data switching circuit 86, and four data selecting circuits 88. The memory cell array 76 is divided into a plurality of blocks in such a way that one block defined for the row address does not correspond to one block defined for the column address. More particularly, one block defined for the column address is a block with shading, while one block defined for the row address is a block with dots. In other words, one block defined for the row address corresponds to four blocks defined for the column block.

Hence, the row redundancy array 80 includes a redundant memory cell array equal to one block for the row address, while the column redundancy array 82 includes a redundant memory cell array equal to one block for the column address. In other words, the first group of the block address including bits RA09, RA10 and RA11 specifies one block for the row address, and the second group thereof including bits RA09, RA10, RA11, CA10 and CA11 specifies one block for the column address. It will be noted that in the structure shown in FIG. 3, one block defined for the row address coincides with one block defined for the column address. That is, the structure shown in FIG. 3 does not have two groups as described above.

FIG. 9 also shows the structure of one block with shading. This block has 512 word lines WL0 through WL511, 1024 pairs of bit lines (BL0, /BL0) through (BL1023, /BL1023), a row decoder 90, a sense amplifier 92, an I/O gate 94, and a column decoder 96. It will be noted that the symbol "/" denotes the inverted version of the signal specified by characters following the symbol. Memory cells are connected to the above word lines and bit lines in a way shown in FIG. 9 (the folded type). Each of the memory cells includes one transistor Tr and one capacitor C. One end of each of the capacitors C is set to a reference voltage (equal to, for example, Vcc/2 where Vcc is the power supply voltage).

A description will now be given of the operation of the DRAM device shown in FIG. 9. One word line is selected by the first address RA00–RA11. At this time, the subsequent address CA00–CA11 has not yet been received. Hence, four blocks specified by the address bits RA09–RA11 are simultaneously selected. For example, the four blocks illustrated with dots shown in FIG. 9 are selected. It will be noted that the block addresses of these four blocks specified by the address bits CA10 and CA11 are different from each other.

In each of the four selected blocks, the address bits RA00–RA08 activates the corresponding word line. The selected word line is settled, and data (binary "1" or "0") stored in the memory cells connected to the selected word line are output to the corresponding bit lines and are then amplified and held in the corresponding unit circuits of the sense amplifier 92. Thereafter, the second address CA00–CA11 is input, and decoded by the corresponding unit circuits of the column decoder 96 in each of the four activated blocks. The decoded address obtained for each pair of bit lines in each of the activated blocks is sequentially applied to the unit circuits of the sense amplifier 92 via the corresponding unit circuit of the I/O gate 94 so that the unit circuits of the sense amplifier 92 (pairs of bit lines) are driven one by one. In this way, data is output to the corresponding data selecting circuit 78 via the sense amplifier 92 and I/O gate 94 on the bit line pair base. The address bits CA10 and CA11 are applied to the four data selecting circuits 78, and one of these circuits is selected. Hence, the data from one of the activated four blocks passes through the corresponding data selecting circuit 78, and is applied to the row redundancy data switching circuit 84. The row redundancy data switching circuit 84 and the column redundancy switching circuit 86 are configured in almost the same way as those shown in FIG. 8.

Figure 10:
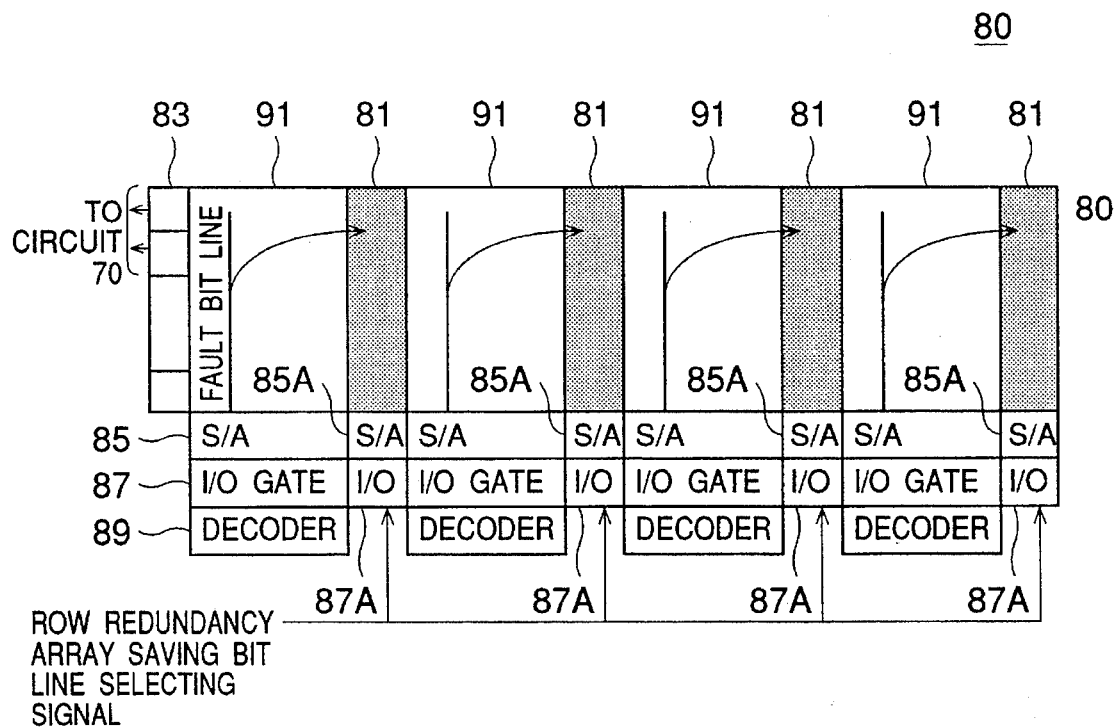
FIG. 10 is a block diagram of a row redundancy array shown in FIG. 9.

FIG. 10 is a block diagram of the row redundancy array 80 shown in FIG. 9. The row redundancy array 80 has a row redundancy circuit 83 and four circuit blocks corresponding to four blocks. Each of the circuit blocks has a row redundancy memory cell array 91, a sense amplifier 85, an I/O gate 87 and a column decoder 89. Further, each of the circuit blocks has a bit line circuit 81 (dotted area) for saving the row redundancy array, a sense amplifier (S/A) 85A, and an I/O gate 87A. The address bits CA10 and CA11 are not used to save a bit-line fault in the row redundancy array 80, as will be described later. Hence, it is necessary to provide the bit line circuits for saving the row redundancy array 80 in the respective four blocks of the row redundancy array 80.

The row redundancy array saving bit lines provided in each of the four blocks are selected by an identical selecting line over which a bit line selecting signal for saving the row redundancy array 80 is transferred. If a bit-line fault occurs in one of the four blocks of the row redundancy array 80 and is saved by the row redundancy array saving bit line, the row redundancy array saving bit lines are also selected in the other blocks. The I/O gates 87 are connected to the corresponding data selecting circuits 88 (FIG. 9), and the I/O gates 87A are connected to the corresponding data selecting circuits 88. The data selecting circuits 88 are driven by the column address bits CA10 and CA11.

Figure 11:
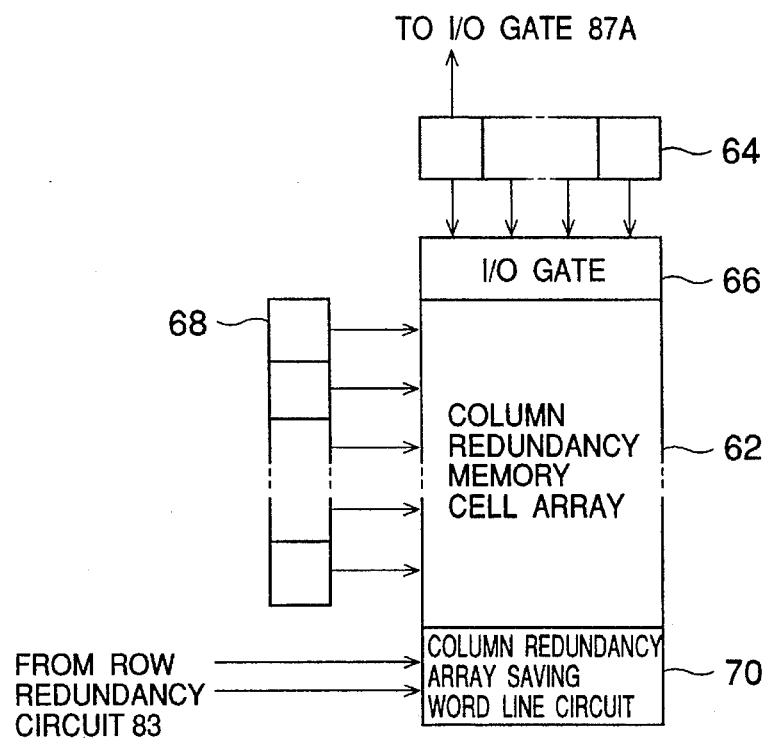
FIG. 11 is a block diagram of a structure of a column redundancy array shown in FIG. 9.

FIG. 11 is a block diagram of the column redundancy array 82 shown in FIG. 9. The basic structure of the column redundancy array 82 is almost the same as that of the column redundancy array 50 shown in FIG. 3, and therefore the same reference numbers as those shown in FIG. 3 are used for the same elements as those shown therein. The column redundancy array 82 has the column redundancy memory cell array 62, the column redundancy circuit 64, the I/O gate 66, the row decoder 68, and the word line circuit 70 for saving the column redundancy array 82.

Figure 12:
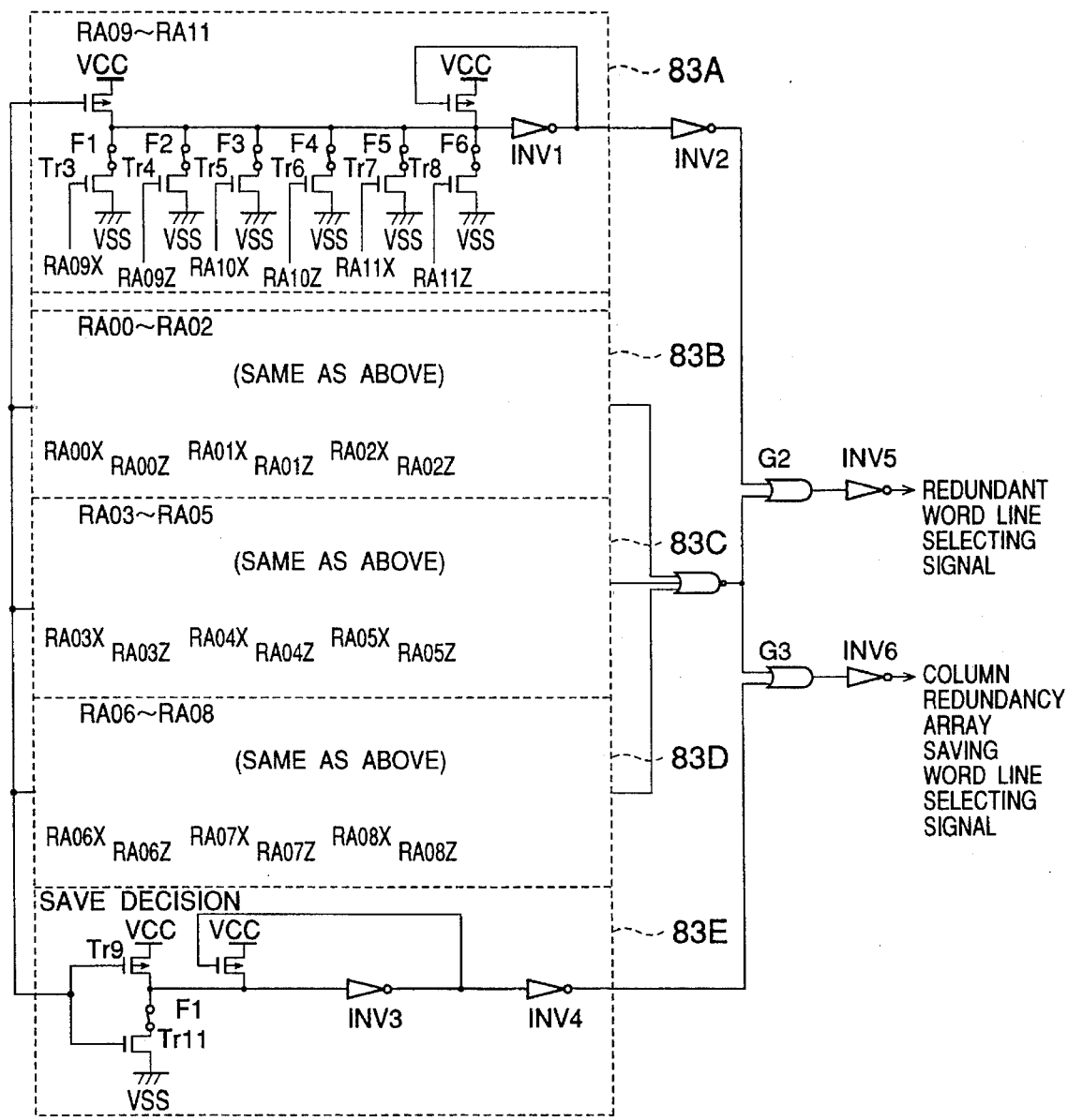
FIG. 12 is a circuit diagram of a structure of a row redundancy circuit shown in FIG. 10.

FIG. 12 is a circuit diagram of the unit circuit (which corresponds to one redundancy word line) of the row redundancy circuit 83 shown in FIG. 10. The unit circuit of the row redundancy circuit 83 includes a circuit 83A that stores the block address of a faulty word line, circuits 83B, 83C and 83D that store the row address of the faulty word line, and a column redundancy array saving decision circuit 83E. A circuit which stores the row address of the faulty word line is divided into the circuits 83B, 83C and 83D in order to reduce the load of making the address comparison. The circuits 83A through 83E are driven by a timing signal $\phi 1$, which will be described later. The timing signal $\phi 1$ switches from the low level to the high level to thereby precharge the circuits 83A–83E when an access by the row address is started.

The circuit 83A, which stores the block address of a faulty word line, makes a decision on the block address bits RA09–RA11. The signals actually processed by the circuit 83A are RA09Z–RA11Z which are in phase with the bits RA09–RA11, and the inverted versions RA09Z–RA11Z of the bits RA09–RA11. The circuit 83A includes P-channel transistors TR1 and Tr2 connected to the power supply line Vcc, fuses F1–F6, N-channel transistors Tr3–Tr8, and an inverter INV1. For example, if the address of a block having a faulty word line is such that RA09=0, RA10=0, and RA11=0, the fuses F1, F3 and F5 are cut (programmed) so that the current paths including these fuses are opened. When RA09=RA10 =RA11=0, then RA09X=RA10X= RA11X=1, and the potential of the input terminal of the inverter INV1 (the common node of the fuses) is retained at the high level after the timing signal $\phi 1$ rises.

The circuits 83B, 83C and 83D are configured in the same way as the circuit 83A. The circuit 83B makes a decision on the address bits RA00–RA02 and the circuit 83C makes a decision on the address bits RA03–RA05, the circuit 83D making a decision on the address bits RA06–RA08. For example, when the address of a faulty word line is RA00=0, the fuse connected to RA00X is cut, and when the address of a faulty word line is RA00=1, the fuse connected to RA00Z is cut. When the input address does not coincide with the address of the faulty word line, currents flow in the fuses and the node connected to the common node of the fuses (which corresponds to the input terminal of the inverter INV1) is switched from the high level to the low level. When the input address coincides with the address of the faulty word line, the related current path is opened and the common node is maintained at the high level.

The output signal of the circuit 83A is applied to a NAND gate G2 via an inverter INV2, and the output signals of the circuits 83B, 83C and 83D are applied to a NOR gate G1. The output signal of the NOR gate G1 is applied to the NAND gates G2 and G3. The output signal of the NAND gate G2 is applied to an inverter INV5, which outputs the redundant word line selecting signal. If the address bits RA00–RA11 do not coincide with the address of the faulty word line, the redundant word line selecting signal is switched from the high level to the low level. If the address match is obtained, the redundant word line selecting signal is retained at the high level.

The column redundancy array saving decision circuit 83E has P-channel transistors TR9 and Tr10, an N-channel transistor Tr11, a fuse F7 and two inverters INV3 and INV4 connected in series. When there is a need to save the corresponding column redundancy array saving word line, the fuse F7 is cut in order to make the circuit 83E output the high-level signal. When saving the column redundancy array 82, the circuit 83A making a decision on the block address bits RA09–RA11 is not programmed. The row address bits RA00–RA08 (the address of a faulty word line in the column redundancy array 82) are programmed. When the address bits RA00–RA08 coincide with the address of the faulty word line in the column redundancy array 82 in the state in which the fuse F7 is open, the word line selecting signal for saving the column redundancy array 82 which is the inverted version of the output signal of the NAND gate G3 output via the inverter INV6 is maintained at the high level. In this case, as has been described previously, the fuses F1–F6 of the circuit 83A are not cut, and thus the redundant word line selecting signal is low.

In order to save the faulty word line in the column redundancy array 82, the row redundancy circuit 83 makes the decision on only the address bits RA00–RA08 and activates the corresponding column redundancy array saving word line. Then, the column redundancy circuit 64 shown in FIG. 14 makes a decision on the address bits RA00–RA11 and CA00–CA11, so that the correct memory cell can be selected.

Figure 13:
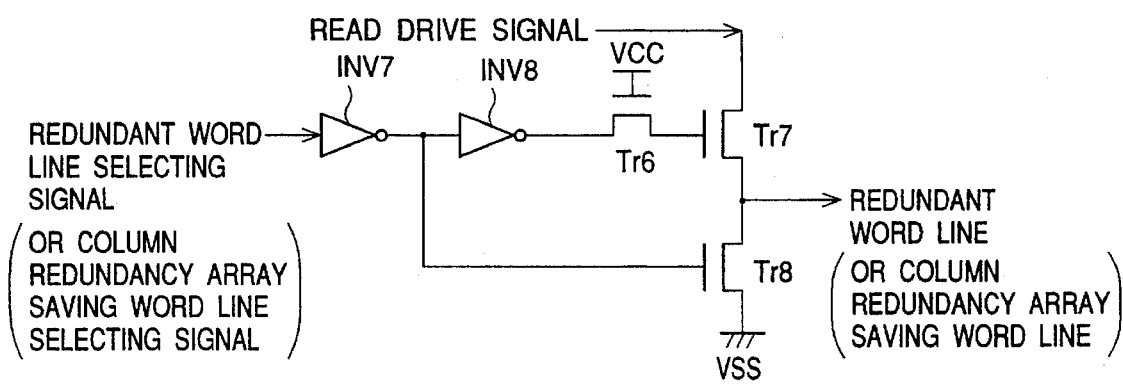
FIG. 13 is a circuit diagram of a structure of a word line driver.

The redundant word lines and the column redundancy array saving word lines are selectively driven by a word line driver shown in FIG. 13. The word line driver shown in FIG. 13 has inverters INV7 and INV8, and N-channel transistors Tr6, Tr7 and Tr8. The inverter INV7 receives the redundant word line selecting signal shown in FIG. 12 (or the word line selecting signal for saving the column redundancy array shown in FIG. 12). The drain of the transistor Tr7 receives a word drive signal specifying the timing at which the word line is driven. The word drive signal is switched from the low level to the high level at a timing determined taking into consideration the completion of the decoding and redundancy decision making. The connection node at which the transistors Tr7 and Tr8 are connected together is connected to the corresponding redundant word line (or the column redundancy array saving word line).

Figure 14:
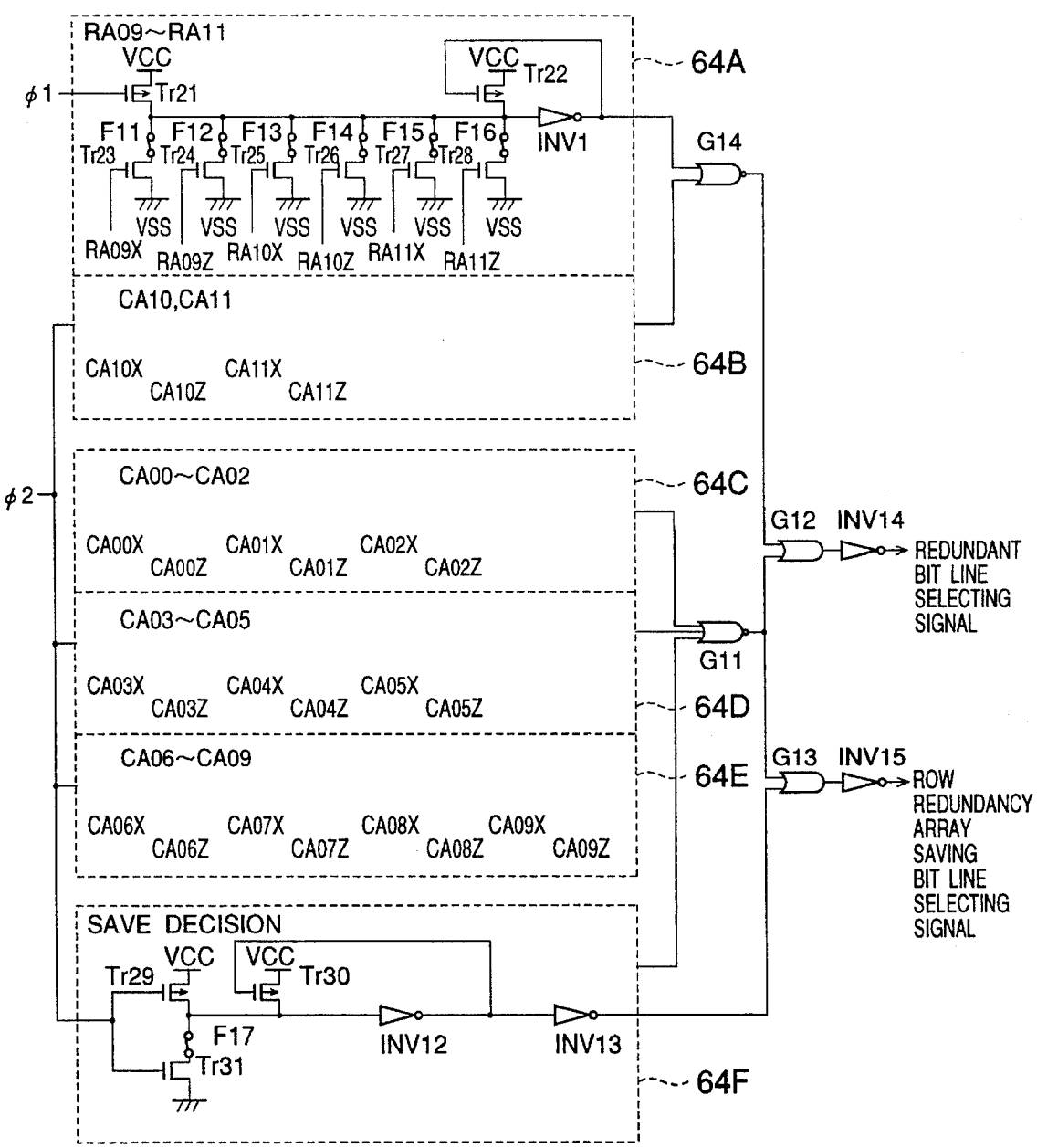
FIG. 14 is a block diagram of the column redundancy circuit shown in FIG. 11.

FIG. 14 is a circuit diagram of the unit circuit of the column redundancy circuit 64 (which corresponds to one redundant bit line) shown in FIG. 11. The unit circuit of the column redundancy circuit 64 includes circuits 64A and 64B which store the block address of a faulty bit line, circuits 64C, 64D and 64E which store the row address of the faulty bit line, and a row redundancy array saving decision circuit 64F. A circuit which stores the row address of the faulty bit line is divided into the circuits 64C, 64D and 64E in order to reduce the load of making the address comparison. The circuit 64A is driven by the aforementioned timing signal φ1, and the circuits 64B–64F are driven by a timing signal φ2, which will be described later. The timing signal φ2 lags behind the timing signal φ1 so that the timing signal φ2 rises from the low level to the high level when an access in response to receipt of the column address, and precharges the circuits 64B–64F.

The circuit 64A, which stores the block address of the faulty bit line, makes a decision on the block address bits RA09–RA11. The signals actually processed in the circuit 64A are RA09Z–RA11Z which are in phase with the bits RA09–RA11, and the inverted versions RA09X–RA11X of the bits RA09–RA11. The circuit 64A includes P-channel transistors TR21 and Tr22 connected to the power supply line Vcc, fuses F11–F16, N-channel transistors Tr23–Tr28, and an inverter INV11. For example, if the address of a block having a faulty bit line is such that RA09=0, RA10=0, and RA11=0, the fuses F11, F13 and F15 are cut (programmed) so that the current paths including these fuses are opened. When RA09=RA10=RA11=0, then RA09Z=RA10Z=RA11Z=1, and the potential of the input terminal of the inverter INV11 (the common node of the fuses) is retained at the high level after the timing signal φ1 rises.

The circuit 64B has the same configuration as the circuit 64A, and makes a decision on the block address bits CA10 and CA11. The output signals of the circuits 64A and 64B are applied to a NOR gate G14, and the output signal of the NOR gate G14 is applied to a NAND gate G12.

The circuits 64C, 64D and 64E are configured in the same way as the circuit 64A. The circuit 64C makes a decision on the address bits CA00–CA02, and the circuit 64D makes a decision on the address bits CA03–CA05, the circuit 64E making a decision on the address bits CA06–CA08. For example, when the address of a faulty bit line is CA00=0, the fuse connected to CA00X is cut, and when the address thereof is CA00=1, the fuse connected to CA00Z is cut. If the input address does not coincide with the address of the faulty bit line, the currents flow in the fuses and the common node for the fuses (which corresponds to the input terminal of the inverter INV1) is switched from the high level to the low level. If the input address coincides with the address of the faulty bit line, the corresponding current path is open and thus the common node is retained at the high level.

The output signals of the circuits 64C, 64D and 64E are applied to a NOR gate 11. The output signal of the NOR gate G11 is applied to the NAND gates G12 and G13. The output signal of the NAND gate G12 is applied to an inverter INV14, which outputs the redundant bit line selecting signal. If the address bits CA00–CA11 do not coincide with the address of the faulty bit line, the redundant bit line selecting signal is switched from the high level to the low level. If the address match is obtained, the redundant bit line selecting signal is maintained at the high level.

The row redundancy array saving decision circuit 64F includes P-channel transistors Tr29 and Tr30, an N-channel transistor Tr31, a fuse F17 and two inverters INV1 and INV2 connected in series. When there is a need to save the corresponding row redundancy array saving bit line, the fuse F17 is cut in order to make the circuit 64F output the high-level signal. When saving the row redundancy array 80, the circuits 64A and 64B making decisions on the block address bits RA09–RA11 and CA10 and CA11 are not programmed. The column address bits CA00–CA08 (the address of a faulty bit line in the row redundancy array 80) are programmed. When the address bits CA00–CA08 coincide with the address of the faulty bit line in the row redundancy array 80 in the state in which the fuse F17 is open, the bit line selecting signal for saving the row redundancy array 80 which is the inverted version of the output signal of the NAND gate G13 output via the inverter INV16 is maintained at the high level. In this case, as has been described previously, the fuses F11–F16 of the circuits 64A and 64B are not cut, and thus the redundant bit line selecting signal is low.

Figure 15:
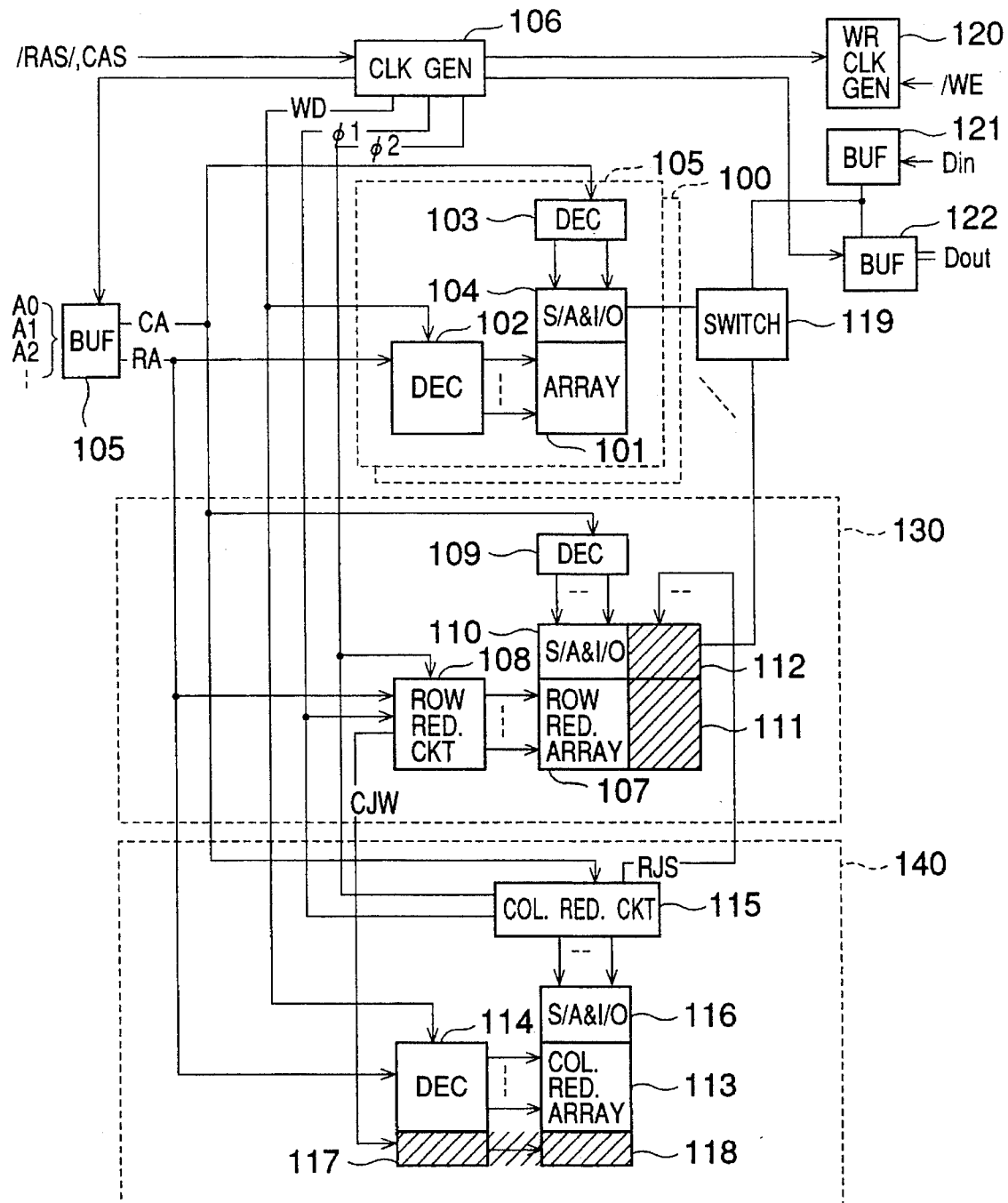
FIG. 15 is a block diagram of the overall structure of a DRAM device which is an example of the semiconductor memory device according to the present invention.

FIG. 15 is a block diagram of the overall structure of a DRAM device, which is formed on a chip. The DRAM device shown in FIG. 15 includes a plurality of memory cell array planes 100, each of which includes a memory cell array 101, a word decoder (row decoder) 102, a column decoder 103 and a sense amplifier and I/O gate 104. The address buffer 105 receives the address signals having address bits A0, A1, A2, . . . , and outputs the row address RA and the column address CA. For example, when the device shown in FIG. 15 is a 16Mbit DRAM device, the address needs 24 bits. In this case, the 24 bits are grouped into two so that the first 12 address bits RA00–RA11 form the row address and the second 12 address bits CA00–CA11 form the column address. The operation timing of the address buffer 105 is defined by a timing signal from the clock generator 106. The clock generator 106 receives an external row address strobe signal /RAS and derives therefrom the aforementioned timing signal φ1. Further, the clock generator 106 receives an external column address strobe signal /CAS and derives therefrom the aforementioned timing signal φ2. Further, the clock generator 106 outputs the aforementioned word drive signal (FIG. 13) and a predetermined timing signal to a write clock generator 120 and a data output buffer 122.

The word decoder 102 decodes the row address RA, and selects the corresponding word line in the memory cell array 101. Then, the word driver provided therein drives the selected word line in synchronism with the timing of the word drive signal WD from the clock generator 106. The column decoder 103 decodes the column address CA, and selects the corresponding bit line in the memory cell array 101.

Further, the device shown in FIG. 15 includes a row redundancy array 130 and a column redundancy array 140. The row redundancy array 130 corresponds to the row redundancy array 48 shown in FIG. 3 or the row redundancy array 80 (including the data selecting circuit 88) shown in FIG. 9. The column redundancy array 140 corresponds to the column redundancy array 50 shown in FIG. 3 or the column redundancy array 82 shown in FIG. 9.

The row redundancy array 130 includes a row redundancy memory cell array 107, a row redundancy circuit 108 including word line drivers, a column decoder 109, a sense amplifier and I/O gate 110, a bit line circuit 111 for saving the row redundancy array 130, and a sense amplifier and I/O gate 112. In FIG. 15, symbol CJW indicates the word line selecting signal for saving the column redundancy array 140.

The column redundancy array 140 includes a column redundancy memory cell array 113, a word decoder (row decoder) 114, a column redundancy circuit 115, a sense amplifier and I/O gate 116, a word line driver 117 and a word line circuit 118 for saving the column redundancy array 140. The column redundancy circuit 115 has the configuration as shown in FIG. 7 or FIG. 14. Symbol RJS shown in FIG. 15 indicates the bit line selecting signal for saving the row redundancy array 130.

A redundant data switching circuit 119 performs a switching operation on the data lines from the sense amplifier and the I/O gates 104, 112 and 117, and selectively connects these circuits to a data input buffer 121 and a data output buffer 122. The data input buffer 121 latches input data Din in synchronism with the timing signal from the write clock generator 120 upon receipt of a write enable signal /WE, and outputs the latched data Din to the circuit 119. The data output buffer 122 latches data from the circuit 119 upon receipt of the timing signal from the clock generator 106, and outputs it to the outside of the device as output data Dout.

DRAM devices as described above are tested in a predetermined way after the devices are produced in order to determine whether there is a faulty memory cell, a faulty word line and/or a faulty bit line. Next, the address of the faulty word line is written (programmed) into the row redundancy circuit 108, and the address of the faulty bit line is written into the column redundancy circuit 115. Similarly, the row redundancy memory cell array 107 and the column redundancy memory cell array 113 are tested to detect a faulty bit line and a faulty word line. If a faulty bit line is detected in the row redundancy memory cell array 107, the column redundancy circuit 115 is programmed so that, if the above faulty bit line is selected, the row redundancy array saving bit line in the bit line circuit 111 for saving the row redundancy array is selected. Similarly, if a faulty word line is detected in the column redundancy memory cell array 113, the row redundancy circuit 108 is programmed so that, if the above faulty word line is selected, the column redundancy array saving word line in the word line circuit 118 is selected.

Alternatively, the prevent invention includes a device in which either the row redundancy array or the column redundancy array is employed. In this case, a circuit for selecting the column redundancy array saving word line or the row redundancy array saving bit line in the aforementioned way may be newly provided on the device. The present invention is not limited to DRAM devices but includes other types of memory devices.

The present invention is not limited to the specifically disclosed embodiments, and variations and modifications may be made without departing from the scope of the present invention.

What is claimed is:

1. A semiconductor memory device comprising:

a memory cell array having memory cells connected to word lines and bit lines;

a redundant memory cell array having either a row redundancy array which is commonly provided to the memory cells and has redundant word lines for saving faulty word lines, or a column redundancy array which is commonly provided to the memory cells and has redundant bit lines for saving faulty bit lines; and a redundancy saving circuit including either one or more row redundancy array saving bit lines for saving one or more bit-line faults occurring in the row redundancy array or one or more column redundancy array saving word lines for saving one or more word-line faults occurring in the column redundancy array.

2. The semiconductor memory device as claimed in claim 1, further comprising means for selecting said one or more row redundancy array saving bit lines from an address signal given to the redundant word lines.

3. The semiconductor memory device as claimed in claim 1, further comprising means for selecting said one or more column redundancy array saving word lines from an address signal given to the redundant bit lines.

4. A semiconductor memory device comprising:

a memory cell array having memory cells connected to word lines and bit lines;

a redundant memory cell array having either a row redundancy array which is commonly provided to the memory cells and has redundant word lines for saving faulty word lines, or a column redundancy array which is commonly provided to the memory cells and has redundant bit lines for saving faulty bit lines; and a redundancy saving circuit for saving one or more bit-line faults occurring in the row redundancy array or for saving one or more word-line faults occurring in the column redundancy array, wherein the memory cells array comprises a plurality of blocks; and the semiconductor memory device comprises means for selecting one of the redundant word lines from a block address for selecting one of the blocks and a row address for selecting one of the word lines of the memory cell array and for selecting said one or more column redundancy array saving word lines from at least one of the block address and the row address.

5. A semiconductor memory device comprising:

a memory cell array having memory cells connected to word lines and bit lines:

a redundant memory cell array having either a row redundancy array which is commonly provided to the memory cells and has redundant word lines for saving faulty word lines, or a column redundancy array which is commonly provided to the memory cells and has redundant bit lines for saving faulty bit lines; and a redundancy saving circuit for saving one or more bit-line faults occurring in the row redundancy array or for saving one or more word-line faults occurring in the column redundancy array, wherein the memory cell array comprises a plurality of blocks; and the semiconductor memory device comprises means for selecting one of the redundant bit lines from a block address for selecting one of the blocks and a column address for selecting one of the bit lines of the memory cell array and for selecting said one or more row redundancy array saving bit lines from at least one of the block address and the column address.

6. A semiconductor memory device comprising:

a memory cell array having memory cells connected to word lines and bit lines;

a row redundancy array which is commonly provided to the memory cells and has redundant word lines for saving faulty word lines;

a column redundancy array which is commonly provided to the memory cells and has redundant bit lines for saving faulty bit lines;

a row redundancy array saving bit line circuit having one or more row redundancy array saving bit lines for saving one or more bit-line faults occurring in the row redundancy array; and a column redundancy array saving word line circuit having one or more column redundancy array saving word lines for saving one or more word-line faults occurring in the column redundancy array.

7. The semiconductor memory device as claimed in claim 6, further comprising:

first means for selecting said one or more row redundancy array saving bit lines from an address signal given to the redundant word lines; and second means for selecting said one or more column redundancy array saving word lines from an address signal given to the redundant bit lines.

8. A semiconductor memory device comprising:

a memory cell array having memory cells connected to word lines and bit lines:

a row redundancy array which is commonly provided to the memory cells and has redundant word lines for saving faulty word lines;

a column redundancy array which is commonly provided to the memory cells and has redundant bit lines for saving faulty bit lines;

a row redundancy array saving bit line circuit for saving one or more bit-line faults occurring in the row redundancy array; and a column redundancy array saving word line circuit for saving one or more word-line faults occurring in the column redundancy array, wherein the memory cell array comprises a plurality of blocks; and wherein the semiconductor memory device comprises first means for selecting one of the redundant word lines from a block address for selecting one of the blocks and a row address for selecting one of the word lines of the memory cell array and for selecting said one or more column redundancy array saving word lines from at least one of the block address and the row address; and second means for selecting one of the redundant bit lines from the block address for selecting one of the blocks and a column address for selecting one of the bit lines of the memory cell array and for selecting said one or more redundancy array saving word lines from at least one of the block address and the column address.

9. The semiconductor memory device as claimed in claim 8, wherein:

said first means comprises means for storing first information regarding whether or not the column redundancy array should be saved and for selecting said one or more column redundancy array saving word lines from at least one of the block address and the row address when said first information shows that the column redundancy array should be saved; and said second means comprises means for storing second information regarding whether or not the row redundancy array should be saved and for selecting said one or more row redundancy array saving bit lines from at least one of the block address and the column address when said second information shows that the row redundancy array should be saved.

10. A semiconductor memory device comprising:

a memory cell array having memory cells connected to word lines and bit lines;

a row redundancy array which is commonly provided to the memory cells and has redundant word lines for saving faulty word lines;

a column redundancy array which is commonly provided to the memory cells and has redundant bit lines for saving faulty bit lines;

a row redundancy array saving bit line circuit for saving one or more bit-line faults occurring in the row redundancy array; and a column redundancy array saving word line circuit for saving one or more word-line faults occurring in the column redundancy array, wherein the block address is grouped into a first group and a second group; and wherein said semiconductor memory device further comprises first means for selecting, for one or more faulty word lines in the memory cell array, one or more redundant word lines of said row redundancy array from the first group of the block address; and wherein said second means comprises means for selecting, for one or more faulty bit lines in the memory cell array, one or more redundant bit lines of said column redundancy array from the second group of the block address.

11. A semiconductor memory device comprising:

a memory cell array having memory cells connected to word lines and bit lines:

a row redundancy array which is commonly provided to the memory cells and has redundant word lines for saving faulty word lines;

a column redundancy array which is commonly provided to the memory cells and has redundant bit lines for saving faulty bit lines;

a row redundancy array saving bit line circuit for saving one or more bit-line faults occurring in the row redundancy array; and a column redundancy array saving word line circuit for saving one or more word-line faults occurring in the column redundancy array;

first means for selecting said one or more row redundancy array saving bit lines from an address signal given to the redundant word lines; and second means for selecting said one or more column redundancy array saving word lines from an address signal given to the redundant bit lines, wherein the row redundancy array saving bit line circuit comprises one or more row redundancy array saving bit lines for each block of a plurality of blocks, said each block being defined for the row address; and the column redundancy array saving word line circuit comprises one or more column redundancy array saving word lines for said each block, said each block being defined for the column address.

12. A semiconductor memory device comprising:

a memory cell array having memory cells connected to word lines and bit lines;

a row redundancy array which is commonly provided to the memory cells and has redundant word lines for saving faulty word lines;

a column redundancy array which is commonly provided to the memory cells and has redundant bit lines for saving faulty bit lines;

a row redundancy array saving bit line circuit for saving one or more bit-line faults occurring in the row redundancy array; and a column redundancy array saving word line circuit for saving one or more word-line faults occurring in the column redundancy array;

first means for selecting said one or more row redundancy array saving bit lines from an address signal given to redundant word lines; and second means for selecting said one or more column redundancy array saving word lines from an address signal given to the redundant bit lines, wherein a switching circuit selecting one of the memory cell array, the row redundancy circuit and the column redundancy circuit in order to receive data from an outside of the semiconductor memory device and transmit data to the outside thereof.

* * * * *